United States Patent
Anderl et al.

(10) Patent No.: US 10,156,403 B2
(45) Date of Patent: *Dec. 18, 2018

(54) DEMAND-BASED CHARGING OF A HEAT PIPE

(71) Applicant: International Business Machines Corporation, Armonk, NY (US)

(72) Inventors: William J. Anderl, Rochester, MN (US); Bret P. Elison, Rochester, MN (US); Phillip V. Mann, Rochester, MN (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 56 days.

This patent is subject to a terminal disclaimer.

(21) Appl. No.: 15/044,594

(22) Filed: Feb. 16, 2016

(65) Prior Publication Data

US 2017/0102190 A1    Apr. 13, 2017

Related U.S. Application Data

(63) Continuation of application No. 14/881,413, filed on Oct. 13, 2015.

(51) Int. Cl.
*F28D 15/06* (2006.01)
*F28D 15/04* (2006.01)
(Continued)

(52) U.S. Cl.
CPC ........ *F28D 15/06* (2013.01); *F28D 15/0275* (2013.01); *F28D 15/0283* (2013.01);
(Continued)

(58) Field of Classification Search
CPC .. F28D 15/0275; F28D 15/0266; F28D 15/04; F28D 15/06; F28D 15/02; H05K 7/20336
See application file for complete search history.

(56) References Cited

U.S. PATENT DOCUMENTS

| 3,414,050 A | 12/1968 | Anand |
| 3,563,309 A | 2/1971 | Basiulis |

(Continued)

FOREIGN PATENT DOCUMENTS

| GB | 1392740 A | * | 4/1975 | ............ F28D 15/06 |
| JP | 2005180802 A | * | 7/2005 | ............ F25B 41/062 |

(Continued)

OTHER PUBLICATIONS

English translation of Japanese Patent Document JP 2006013408 A.
(Continued)

*Primary Examiner* — David Teitelbaum
*Assistant Examiner* — Harry Arant
(74) *Attorney, Agent, or Firm* — Martin & Associates, LLC; Derek P. Martin

(57) ABSTRACT

A heat pipe includes a reservoir of liquid that is connected to a horizontal portion of the heat pipe via a capillary connection. The heat pipe includes a temperature sensor in proximity to a heat interface in the horizontal portion and a controller that controls a heater for the reservoir. As power into the heat pipe increases, the controller turns on the heater, causing the temperature of the liquid in the reservoir to rise. Liquid then passes from the reservoir through the capillary connection into the horizontal portion, thereby dynamically increasing the amount of liquid in the heat pipe, which increases performance of the heat pipe at higher power levels. When the heater is off, as the heat pipe cools, the liquid condenses and flows back through the capillary connection into the reservoir. The result is a heat pipe that provides demand-based charging of the liquid based on power level.

9 Claims, 4 Drawing Sheets

(51) Int. Cl.
   *F28D 15/02* (2006.01)
   *F28F 3/02* (2006.01)
   *F28F 21/08* (2006.01)
   *H01L 23/427* (2006.01)
   *F28D 21/00* (2006.01)

(52) U.S. Cl.
   CPC .............. *F28D 15/046* (2013.01); *F28F 3/02* (2013.01); *F28F 21/085* (2013.01); *H01L 23/427* (2013.01); *F28D 2015/0216* (2013.01); *F28D 2021/0028* (2013.01)

(56) References Cited

U.S. PATENT DOCUMENTS

| | | | |
|---|---|---|---|
| 3,741,289 A | 6/1973 | Moore | |
| 3,818,980 A | 6/1974 | Moore, Jr. | |
| 4,026,348 A * | 5/1977 | Roberts, Jr. | F28D 15/06 165/104.24 |
| 4,377,198 A | 3/1983 | Welling et al. | |
| 5,159,972 A * | 11/1992 | Gunnerson | F24F 12/002 165/104.21 |
| 5,667,003 A | 9/1997 | Mahdjuri-Sabet | |
| 5,816,313 A | 10/1998 | Baker | |
| 6,810,946 B2 | 11/2004 | Hoang | |
| 6,981,543 B2 | 1/2006 | Chesser et al. | |
| 7,004,240 B1 | 2/2006 | Kroliczek et al. | |
| 7,549,461 B2 | 6/2009 | Kroliczek et al. | |
| 8,109,325 B2 | 2/2012 | Kroliczek et al. | |
| 2003/0051857 A1 | 3/2003 | Cluzet et al. | |
| 2003/0192686 A1 | 10/2003 | Hisai et al. | |
| 2004/0254532 A1* | 12/2004 | Mehier | A61B 18/04 604/113 |
| 2005/0092481 A1 | 5/2005 | Wyatt et al. | |
| 2006/0162903 A1 | 7/2006 | Bhatti et al. | |
| 2010/0051240 A1 | 3/2010 | Ipposhi et al. | |
| 2010/0051254 A1 | 3/2010 | Ipposhi et al. | |
| 2010/0221627 A1 | 9/2010 | Nakakubo | |
| 2011/0056657 A1* | 3/2011 | Lin | F28D 15/0233 165/104.26 |
| 2012/0048519 A1 | 3/2012 | Gruss et al. | |
| 2013/0228313 A1 | 9/2013 | Fried | |
| 2015/0114607 A1 | 4/2015 | Moscatelli | |

FOREIGN PATENT DOCUMENTS

| | | |
|---|---|---|
| JP | 2006013408 A | 1/2006 |
| JP | 2011069546 A | 9/2009 |

OTHER PUBLICATIONS

English Translation of JP2011069546, dated Sep. 25, 2009.
Appendix P—List of IBM Patents or Patent Applications Treated As Related.
Anderl et al., "Demand-Based Charging of a Heat Pipe" U.S. Appl. No. 14/881,413, filed Oct. 13, 2015.
Anderl et al., "Demand-Based Charging of a Heat Pipe" U.S. Appl. No. 14/881,393, filed Oct. 13, 2015.
Anderl et al., "Demand-Based Charging of a Heat Pipe" U.S. Appl. No. 15/044,375, filed Feb. 16, 2016.
Anderl et al., "Demand-Based Charging of a Heat Pipe" U.S. Appl. No. 15/813,143, filed Nov. 14, 2017.
Anderl et al., "Demand-Based Charging of a Heat Pipe" U.S. Appl. No. 15/814,371, filed Nov. 15, 2017.
Appendix P—List of IBM Patents or Patent Applications Treated As Related, dated Dec. 1, 2017.

* cited by examiner

DEMAND-BASED CHARGING OF A HEAT PIPE

BACKGROUND

1. Technical Field

This disclosure generally relates to heat pipes, and more specifically relates to a heat pipe that includes one or more reservoirs that provide demand-based charging.

2. Background Art

A heat pipe is used to transfer heat between a hot interface and a cold interface. The heat pipe includes a liquid in contact with a thermally conductive solid surface at the hot interface. When the hot interface heats up, the liquid turns into a vapor by absorbing heat from the hot interface. The vapor then travels along the heat pipe to the cold interface and condenses back into liquid, which releases the latent heat. The liquid then returns to the hot interface, and the cycle repeats. Heat pipes are highly effective thermal conductors, with an effective thermal conductivity orders of magnitude larger than for other heat transfer methods, such as a solid metal like copper.

Heat pipes are charged with a liquid. The amount of liquid in the heat pipe determines the performance of the heat pipe. As the rate of heat energy absorbed by the heat pipe increases, there is a possibility all of the liquid will turn to vapor. At this point, the temperature of the vapor within the pipe will begin to rapidly increase. As a result, the thermal resistance of the heat pipe increases exponentially. Consequently, most known heat pipes are usually overcharged or saturated with the liquid to avoid the increase of thermal resistance caused by turning all of the liquid into vapor. However, at lower heat energy rates, the performance of heat pipes that are overcharged or saturated is less than heat pipes that are charged with less liquid.

Heat pipes are commonly used in heat sinks for modern electronics, such as processors. To assure the heat sinks work properly when the processor is functioning at high power, the heat pipes in heat sinks are typically overcharged or saturated with liquid. This same heat pipe will work less efficiently at a lower power, meaning the temperature of the processor will be higher than if a heat pipe that were less charged with liquid were used. Thus, the designer of a heat sink that uses a heat pipe must make a tradeoff between performance of the heat sink at lower powers and performance of the heat sink at higher powers. Because excessively high temperatures can cause a catastrophic failure in a processor, the decision is usually made to overcharge or saturate the heat pipes in a processor heat sink so they can handle maximum processor power.

SUMMARY

A heat pipe includes a reservoir of liquid that is connected to a horizontal portion of the heat pipe via a capillary connection. The heat pipe includes a temperature sensor in proximity to a heat interface in the horizontal portion and a controller that controls a heater for the reservoir. As power into the heat pipe increases, the controller turns on the heater, causing the temperature of the liquid in the reservoir to rise. Liquid then passes from the reservoir through the capillary connection into the horizontal portion, thereby dynamically increasing the amount of liquid in the heat pipe, which increases performance of the heat pipe at higher power levels. When the reservoir heater is turned off, as the heat pipe cools, the liquid condenses and flows back through the capillary connection into the reservoir. The result is a heat pipe that is more efficient at lower power levels and still maintains high efficiency at higher power levels due to the demand-based charging of the liquid based on power level.

The foregoing and other features and advantages will be apparent from the following more particular description, as illustrated in the accompanying drawings.

BRIEF DESCRIPTION OF THE DRAWING(S)

The disclosure will be described in conjunction with the appended drawings, where like designations denote like elements, and:

DETAILED DESCRIPTION

The disclosure and claims herein relate to a heat pipe that includes a reservoir of liquid that is connected to a horizontal portion of the heat pipe via a capillary connection. The heat pipe includes a temperature sensor in proximity to a heat interface in the horizontal portion and a controller that controls a heater for the reservoir. As power into the heat pipe increases, the controller turns on the heater, causing the temperature of the liquid in the reservoir to rise. Liquid then passes from the reservoir through the capillary connection into the horizontal portion, thereby dynamically increasing the amount of liquid in the heat pipe, which increases performance of the heat pipe at higher power levels. When the reservoir heater is turned off, as the heat pipe cools, the liquid condenses and flows back through the capillary connection into the reservoir. The result is a heat pipe that is more efficient at lower power levels and still maintains high efficiency at higher power levels due to the demand-based charging of the liquid based on power level.

Figure 1:
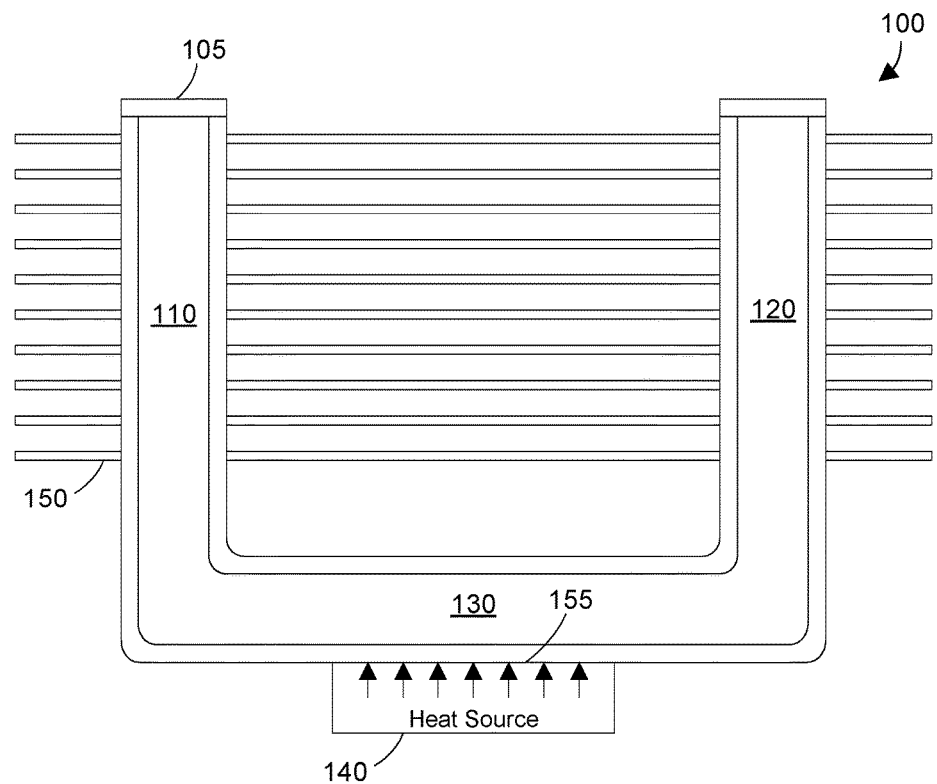
FIG. 1 is a block diagram of a heat sink that includes a heat pipe.

Referring to FIG. 1, a heat sink 100 is shown that includes a heat pipe 105 in a U-shape with vertical portions 110 and 120 coupled to a common horizontal portion 130. The horizontal portion 130 is charged with a first quantity of a liquid. The heat sink 100 includes an interface 155 on the bottom surface of horizontal portion 130 that thermally couples a heat source 140 to the heat pipe 105 to transfer heat away from the heat source 140. One example of a heat source is an integrated circuit, such as a processor. The heat sink 100 includes multiple fins 150 as known in the art that help dissipate heat in the heat pipe 105.

Figure 2:
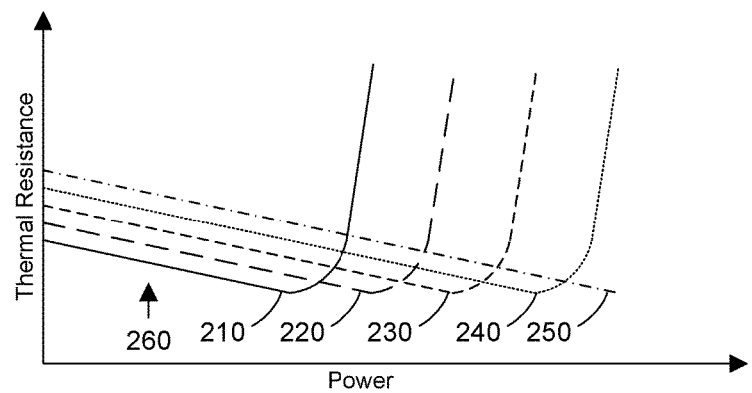
FIG. 2 is a graph showing thermal resistance as a function of power for the heat sink in FIG. 1 based on different levels of liquid in the heat pipe.

Performance of the heat sink 100 is shown graphically in FIG. 2, with thermal resistance of the heat sink plotted as a function of power for various levels of liquid charging in the heat pipe. Note that heat sink 100 shown in FIG. 1 in the prior art would typically be charged with a fixed level of liquid during manufacture then sealed, which means that known heat sinks have a performance defined by their fixed liquid charge. FIG. 2 shows multiple lines that each represents performance of a heat sink such as heat sink 100 with a different charge of liquid. Line 210 shows performance of the heat sink 100 when the heat pipe 105 has a very low charge of liquid. Line 220 shows performance of the heat sink 100 when the heat pipe 105 has a low charge of liquid. Line 230 shows performance of the heat sink 100 when the heat pipe 105 has a nominal charge of liquid. Line 240 shows performance of the heat sink 100 when the heat pipe 105 has an overcharge of liquid. And line 250 shows performance of the heat sink 100 when the heat pipe 105 is saturated with liquid. At a lower power shown in FIG. 2 at 260, the thermal resistance of the heat pipe with lesser liquid charges is less than the thermal resistance of the heat pipe with greater liquid charges. But the lesser liquid charges increase in thermal resistance at significantly lower power than for greater liquid charges. FIG. 2 shows graphically why most manufacturers of heat sinks that use heat pipes use an overcharge of liquid or saturation of liquid in the heat pipes, since higher powers can lead to catastrophic failure in integrated circuits, and heat pipes with an overcharge of saturation of liquid will operate at much higher powers without a significant increase of thermal resistance.

Figure 3:
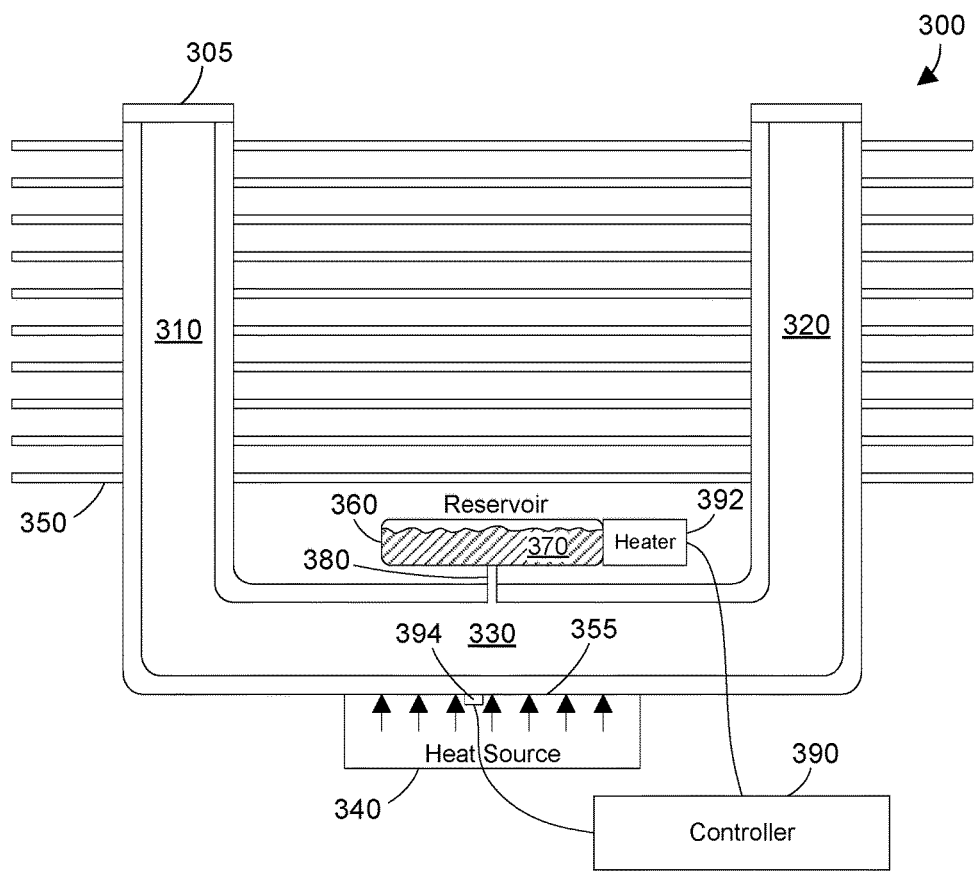
FIG. 3 is a block diagram of a heat sink that includes a heat pipe that has a reservoir coupled to the horizontal portion of the heat pipe via a capillary connection.

An improved heat sink 300 is shown in FIG. 3, which includes a heat pipe 305 in a U-shape with vertical portions 310 and 320 coupled to a common substantially horizontal portion 330. The heat pipe 305 includes an interface 355 on the bottom surface of the substantially horizontal portion 330 that thermally couples a heat source 340 to the heat pipe 305 to transfer heat away from the heat source 340. Heat source 340 could be an integrated circuit, such as a processor. In the most preferred implementation, the substantially horizontal portion 330 overlies the interface 355 and is charged with a first quantity of a liquid. The heat sink 300 includes multiple fins 350 that are thermally coupled to the heat pipe to help dissipate heat in the heat pipe 305.

Heat pipe 305 includes a reservoir 360 that is coupled to the substantially horizontal portion 330 via a capillary connection 380. Reservoir 360 is preferably charged with a second quantity of liquid 370. A heater 392 is thermally coupled to the reservoir 360 to heat the liquid 370. Heater 392 is turned on and off by a controller 390, which is coupled to a temperature sensor 394 in proximity to the interface 355. Note the term "proximity" can mean any suitable distance. In one implementation, the temperature sensor 394 is placed adjacent the interface 355. In another implementation, the temperature sensor 294 is placed farther away from the interface 355 at a convenient location. In either case, the controller 390 can be programmed to activate the heater 392 when the temperature sensor senses a temperature above some defined threshold.

The temperature sensor 394 can be any suitable sensor that is capable of sensing a temperature. For example, a thermistor is one suitable implementation for temperature sensor 394. Other implementations could also be used, including other types of analog temperature sensors, and digital temperature sensors that communicate the temperature to controller 390 via a digital communication link.

The capillary connection 380 between the substantially horizontal portion 330 and the reservoir 360 can have any suitable diameter and design that provides capillary action. For example, the capillary connection 380 is preferably a cylindrical connection with a diameter of 10 micrometers to 2 millimeters (mm). In a more specific implementation, the capillary connection has a diameter of 0.1 mm to 0.3 mm. In the most preferred implementation, the capillary connection has a diameter of 0.15 mm. In addition, the capillary connection could include any suitable coating. For example, if water is the liquid being used, a hydrophobic coating may be placed on the inner surface of the capillary connection 380, which can alter the flow properties between the reservoir 360 and the substantially horizontal portion 330. With a hydrophobic coating, liquid will flow from the reservoir 360 to the substantially horizontal portion 330 when the reservoir 360 is cooler than the substantially horizontal portion 330. In the absence of a hydrophobic coating on the interior surface of the capillary connection 380, liquid could be forced from the reservoir 360 to the substantially horizontal portion 330 by increasing the temperature of the reservoir 360 using heater 392 such that the reservoir 360 is at a higher temperature than the substantially horizontal portion 330.

When the power level of the heat sink is low, the second quantity of the liquid 370 in the reservoir 360 is isolated by the capillary connection 380 from the first quantity of the liquid in the substantially horizontal portion 330. When the power level of the heat sink increases, the temperature sensed by the temperature sensor 394 increases. Once the temperature sensed by the temperature sensor 394 exceeds a defined threshold value, the controller 390 turns on the heater 392. Turning on the heater 392 causes the temperature of the liquid 370 in the reservoir 360 to rise, and once the temperature is more than the temperature in the substantially horizontal portion 330, the liquid 370 will flow through the capillary connection 380 from the reservoir 360 to the substantially horizontal portion 330. This preferably causes the a portion of the second quantity of liquid 370 to combine with the first quantity of the liquid in the substantially horizontal portion 330, resulting in total liquid that is equal to the sum of the first quantity and the portion of the second quantity that moved through the capillary connection into the substantially horizontal portion. As the temperature in the heat pipe decreases after the heater 392 is turned off, the liquid will move from the substantially horizontal portion 330 through the capillary connection 380 to the reservoir 360. The reservoir 360 and capillary connection 380 thus provide a way to dynamically change the liquid charge of the heat pipe under control of the controller 390.

The performance of the heat pipe 305 is a function of the size of the reservoir 360, the size of the capillary connection 380, the number of power levels for the heater 392, and the function of the controller 390, according to the temperature sensed by the temperature sensor 394. Heater 392 may include multiple different power levels instead of being just on or off. One skilled in the art will understand based on the disclosure herein how to select the function of the controller 390 to achieve a desired dynamic liquid charge in the heat pipe 305 to provide a specific desired functionality. With an appropriate design of the heat pipe 305, the performance can closely approximate the performance shown in FIG. 4.

Figure 4:
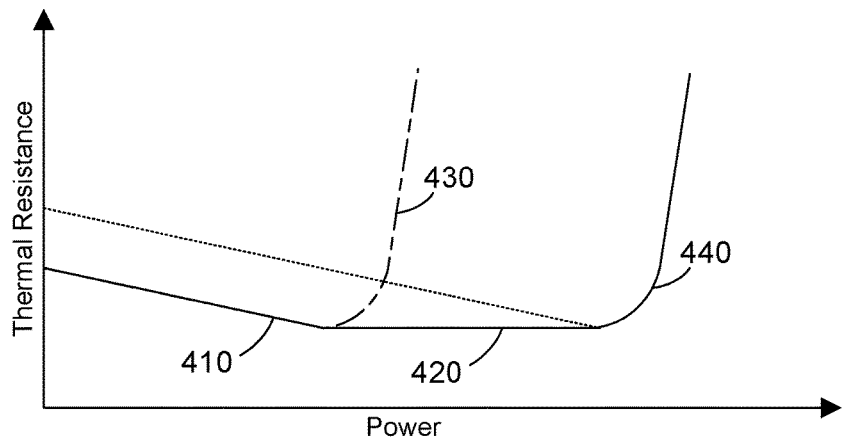
FIG. 4 is a graph showing thermal resistance as a function of power for the heat sink in FIG. 3.

By providing a heat sink with a heat pipe that includes a reservoir as shown in FIG. 3, the performance of the heat pipe increases due to the dynamic charging of liquid into the heap pipe as the temperature (and hence, power) rises. A graph of the performance of the heat sink 300 shown in FIG. 3 is shown in FIG. 4. This example assumes the reservoir 360 is filled with liquid during manufacture of the heat sink, and the substantially horizontal portion 330 of the heat pipe otherwise has a very low charge of liquid besides the liquid in the reservoir 360. The linear portion 410 in FIG. 4 is the same as the linear portion of line 210 in FIG. 2. We assume, however, that at a temperature just before the bend in the line 430 that shows an increase in thermal resistance for a very lightly charged heat pipe, liquid begins to move from the reservoir 360 through the capillary connection 380 to the substantially horizontal portion 330. This increases the amount of liquid in the heat pipe. This is why the heat pipe herein has dynamic charging of liquid. The performance at portion 420 in FIG. 4 is linear with power until a sufficient power is reached that the thermal resistance increases dramatically, as shown at 440. Note that 440 corresponds to the upper portion of line 240 in FIG. 2. Comparing the performance in FIG. 4 to the performance in FIG. 2 shows the performance of the heat sink 300 in FIG. 3 is optimized across all operating temperatures. At low temperatures, the heat sink 300 has the performance of a heat pipe that is very lightly charged. But as the temperature increases, the charging liquid in the reservoir is released. The dynamic charging of liquid in the heat pipe 305 in FIG. 3 provides much better performance than a heat pipe 105 that does not have a reservoir that provides dynamic charging, as shown in FIG. 1.

Figure 5:
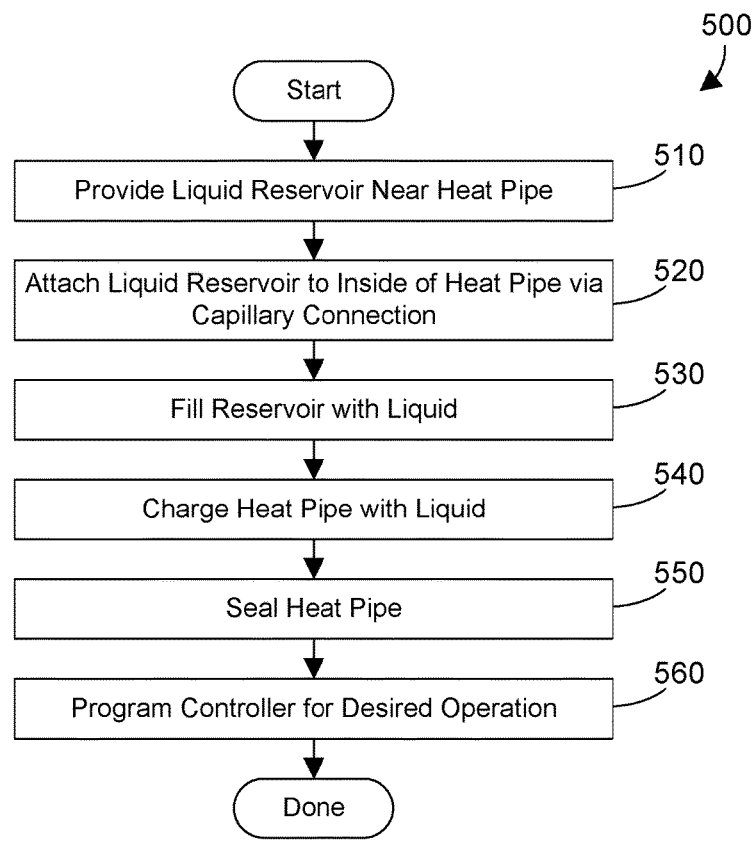
FIG. 5 is a flow diagram of a method for manufacturing a heat pipe.

FIG. 5 shows a method 500 for manufacturing the heat sink 300 shown in FIG. 3. Note that many other steps could be included in the manufacturing process, as known in the art. A liquid reservoir is provided near a heat pipe (step 510). The liquid reservoir is attached to the inside of the heat pipe via a suitable capillary connection (step 520). The reservoir is filled with liquid (step 530). The heat pipe is then charged with liquid (step 540) and sealed (step 550). It is known in the art to evacuate all the air in the heat pipe before sealing. The controller is then programmed for the desired operation (step 560). Note the manufacturing process shown in FIG. 5 includes one or more steps that are not performed when manufacturing known heat pipes. The result is a heat pipe with increased thermal performance due to the dynamic charging of liquid in the heat pipe as the temperature of the heat pipe rises.

Note the programming of the controller 390 in step 560 determines performance of the heat pipe. Controller 390 can be any suitable form of controller that is capable of reading any suitable temperature sensor and in response, turning the heater 392 on and off. For example, controller 390 could be a simple state machine. In the alternative, the controller 390 could be a microcontroller that includes one or more inputs for reading the temperature sensor 394 and one or more outputs for turning the heater 392 on and off. The disclosure and claims herein expressly extend to any suitable implementation of controller 390 with any suitable level of functionality that causes liquid 370 to flow through the capillary connection 380 into the substantially horizontal portion 330 when the level of liquid in the heat pipe needs to be dynamically increased, and that causes liquid to flow from the substantially horizontal portion 330 through the capillary connection 380 into the reservoir 360 when the level of liquid in the heat pipe needs to be dynamically decreased.

Figure 6:
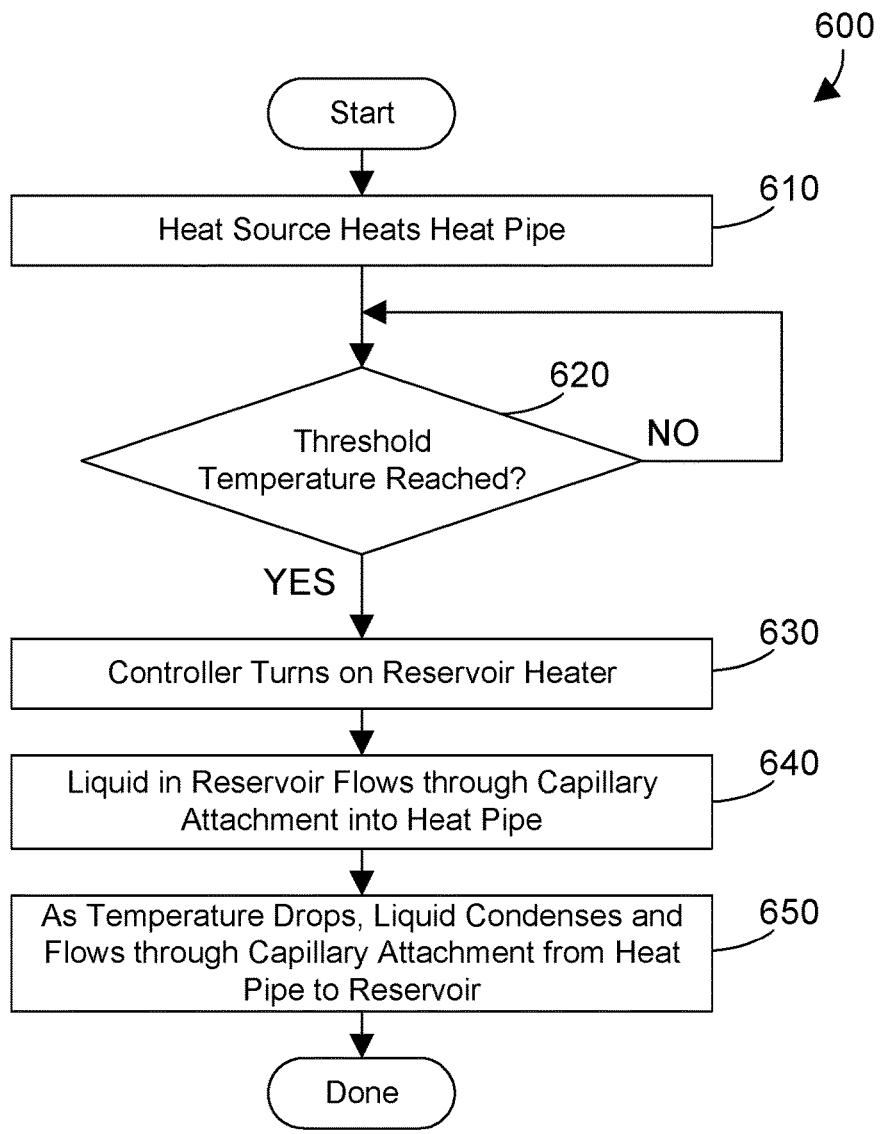
FIG. 6 is a flow diagram of a method of operation for the heat pipe in FIG. 3.

FIG. 6 shows a method 600 that represents how the heat pipe 305 in FIG. 3 works. We assume the heat pipe is in the condition shown in FIG. 3 when method 600 initially begins. As long as the temperature read by the controller 390 from the temperature sensor 394 is below a defined threshold temperature (step 620=NO), method 600 loops back and continues until the threshold temperature is reached (step 620=YES). In response, the controller turns on the reservoir heater (step 630). Once the temperature of the reservoir is hotter than the temperature of the substantially horizontal portion 330, the liquid 370 in the reservoir 360 flows through the capillary connection 380 into the substantially horizontal portion 330 of the heat pipe (step 640). After the heater is turned off, as the temperature in the reservoir drops, liquid condenses and flows from the substantially horizontal portion 330 to the reservoir 360 through the capillary connection 380 (step 650). Method 600 is then done.

Note that method 600 could include steps that turn the heater on or off at different temperatures, or to turn the heater power up or down when the heater has multiple power settings, in order to achieve an equilibrium at a given power level, where liquid is not moving in either direction through the capillary connection. The programming of the controller would thus allow tuning the performance of the heat pipe according to the specific design and power levels.

While a single reservoir 360 is shown in FIG. 3, multiple reservoirs could also be used. These multiple reservoirs could have different thresholds in the controller 390 for turning on their respective heaters, and their heaters may have multiple power levels, thereby providing a level of granularity regarding how much water is added to the heat pipe and at what temperatures.

Any suitable liquid may be used to charge the heat pipe disclosed herein. The suitability of the liquid depends on factors such as the material used to form the heat pipe and the desired performance of the heat pipe. For heat sinks used for integrated circuits, the preferred material for the heat pipe is copper, and the preferred liquid is water.

A heat pipe includes a reservoir of liquid that is connected to a horizontal portion of the heat pipe via a capillary connection. The heat pipe includes a temperature sensor in proximity to a heat interface in the horizontal portion and a controller that controls a heater for the reservoir. As power into the heat pipe increases, the controller turns on the heater, causing the temperature of the liquid in the reservoir to rise. Liquid then passes from the reservoir through the capillary connection into the horizontal portion, thereby dynamically increasing the amount of liquid in the heat pipe, which increases performance of the heat pipe at higher power levels. When the reservoir heater is turned off, as the heat pipe cools, the liquid condenses and flows back through the capillary connection into the reservoir. The result is a heat pipe that is more efficient at lower power levels and still maintains high efficiency at higher power levels due to the demand-based charging of the liquid based on power level.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A method for dynamically charging a heat pipe with a liquid, the method comprising:
   providing the heat pipe comprising:
     an interface for thermally coupling a heat source to the heat pipe;
     a substantially horizontal portion charged with a first quantity of liquid and coupled to the interface;
     a reservoir that contains a second quantity of the liquid, the reservoir overlying the substantially horizontal portion and having a width and a height, where the width is substantially greater than the height;
     a capillary connection that connects the reservoir to the substantially horizontal portion, wherein the capillary connection has a diameter of 0.1 millimeters (mm) to 0.3 mm;
     a heater thermally coupled to the reservoir;
     a temperature sensor in proximity to the interface; and
     a controller coupled to the heater and the temperature sensor;

detecting when a temperature detected by the temperature sensor exceeds a predetermined threshold; and in response to the detecting when the temperature detected by the temperature sensor exceeds the predetermined threshold, turning on the heater to cause at least a portion of the second quantity of liquid in the reservoir to pass from the reservoir through the capillary connection into the substantially horizontal portion;

detecting when the temperature detected by the temperature sensor is less than the predetermined threshold; and in response to the detecting when the temperature detected by the temperature sensor is less than the predetermined threshold, turning off the heater to cause at least a portion of the second quantity of liquid in the substantially horizontal portion to pass from the substantially horizontal portion through the capillary connection into the reservoir via capillary action as the reservoir cools.

2. The method of claim 1 wherein the heat pipe further comprises at least one vertical member connected with the substantially horizontal portion.

3. The method of claim 1 wherein the heat pipe further comprises a plurality of fins that dissipate heat.

4. The method of claim 1 wherein the substantially horizontal portion of the heat pipe overlies the interface.

5. The method of claim 1 wherein the substantially horizontal portion, the reservoir, and the capillary connection are made of copper.

6. The method of claim 5 wherein the liquid comprises water.

7. The method of claim 1 wherein the capillary connection has a hydrophobic coating.

8. A method for manufacturing a heat sink comprising:
constructing a heat pipe comprising:
an interface for thermally coupling a heat source to the heat pipe;
a substantially horizontal portion charged with a first quantity of liquid and coupled to the interface;
a reservoir that contains a second quantity of the liquid, the reservoir overlying the substantially horizontal portion and having a width and a height, where the width is substantially greater than the height;
a capillary connection that connects the reservoir to the substantially horizontal portion and draws liquid from the substantially horizontal portion into the reservoir via capillary action when a temperature of the reservoir is less than a temperature of the substantially horizontal portion, wherein the capillary connection has a diameter of 0.1 millimeters (mm) to 0.3 mm;
a heater thermally coupled to the reservoir;
a temperature sensor in proximity to the interface; and
a controller coupled to the heater and the temperature sensor; and
thermally coupling a plurality of thermally-conductive fins to the heat pipe.

9. The method of claim 8 wherein the capillary connection has a hydrophobic coating.

* * * * *